(12) United States Patent
Naganokawa et al.

(10) Patent No.: US 9,123,620 B2
(45) Date of Patent: Sep. 1, 2015

(54) SOLID-STATE IMAGE CAPTURE DEVICE, DRIVE METHOD THEREFOR, AND ELECTRONIC APPARATUS

(71) Applicant: SONY CORPORATION, Tokyo (JP)

(72) Inventors: Haruhisa Naganokawa, Kanagawa (JP); Shizunori Matsumoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 251 days.

(21) Appl. No.: 13/686,460

(22) Filed: Nov. 27, 2012

(65) Prior Publication Data

US 2013/0147997 A1 Jun. 13, 2013

(30) Foreign Application Priority Data

Dec. 9, 2011 (JP) ................. 2011-270282

(51) Int. Cl.
| | |
|---|---|
| H04N 5/335 | (2011.01) |
| H04N 5/369 | (2011.01) |
| H04N 5/372 | (2011.01) |
| H01L 27/146 | (2006.01) |
| H01L 27/148 | (2006.01) |
| H04N 5/378 | (2011.01) |

(52) U.S. Cl.
CPC ........ *H01L 27/148* (2013.01); *H01L 27/14609* (2013.01); *H04N 5/335* (2013.01); *H04N 5/3698* (2013.01); *H04N 5/378* (2013.01)

(58) Field of Classification Search
CPC ..... H04N 5/369; H04N 5/3698; H04N 5/374; H04N 5/376; H04N 5/378
USPC .................. 348/294, 296, 302, 308
See application file for complete search history.

(56) References Cited

U.S. PATENT DOCUMENTS

| | | | |
|---|---|---|---|
| 7,619,670 B2* | 11/2009 | Shah ............................ 348/296 |
| 8,829,411 B2* | 9/2014 | Oshikubo et al. .......... 250/208.1 |
| 2009/0072120 A1* | 3/2009 | McGarry et al. ........... 250/208.1 |
| 2010/0002117 A1* | 1/2010 | Iwane et al. .................. 348/308 |
| 2011/0234871 A1* | 9/2011 | Taruki et al. ................. 348/297 |
| 2011/0279719 A1* | 11/2011 | Mabuchi ....................... 348/300 |
| 2012/0127356 A1* | 5/2012 | Matsuura ..................... 348/313 |
| 2012/0153131 A1* | 6/2012 | Ishimoto et al. ........... 250/208.1 |
| 2013/0147997 A1* | 6/2013 | Naganokawa et al. ....... 348/302 |

* cited by examiner

*Primary Examiner* — Timothy J Henn
(74) *Attorney, Agent, or Firm* — Dentons US LLP

(57) ABSTRACT

A solid-state image capture device includes unit pixels including transfer gates that transfer charges to diffusion layers, the charges being obtained by photoelectric conversion performed by photoelectric converting sections; signal lines to which signals output from the unit pixels are read out: current sources connected to the signal lines; and a driver that electrically cuts off connections between the unit pixels and the signal lines and the signal lines and the current sources in a transfer period of the transfer gates.

10 Claims, 12 Drawing Sheets

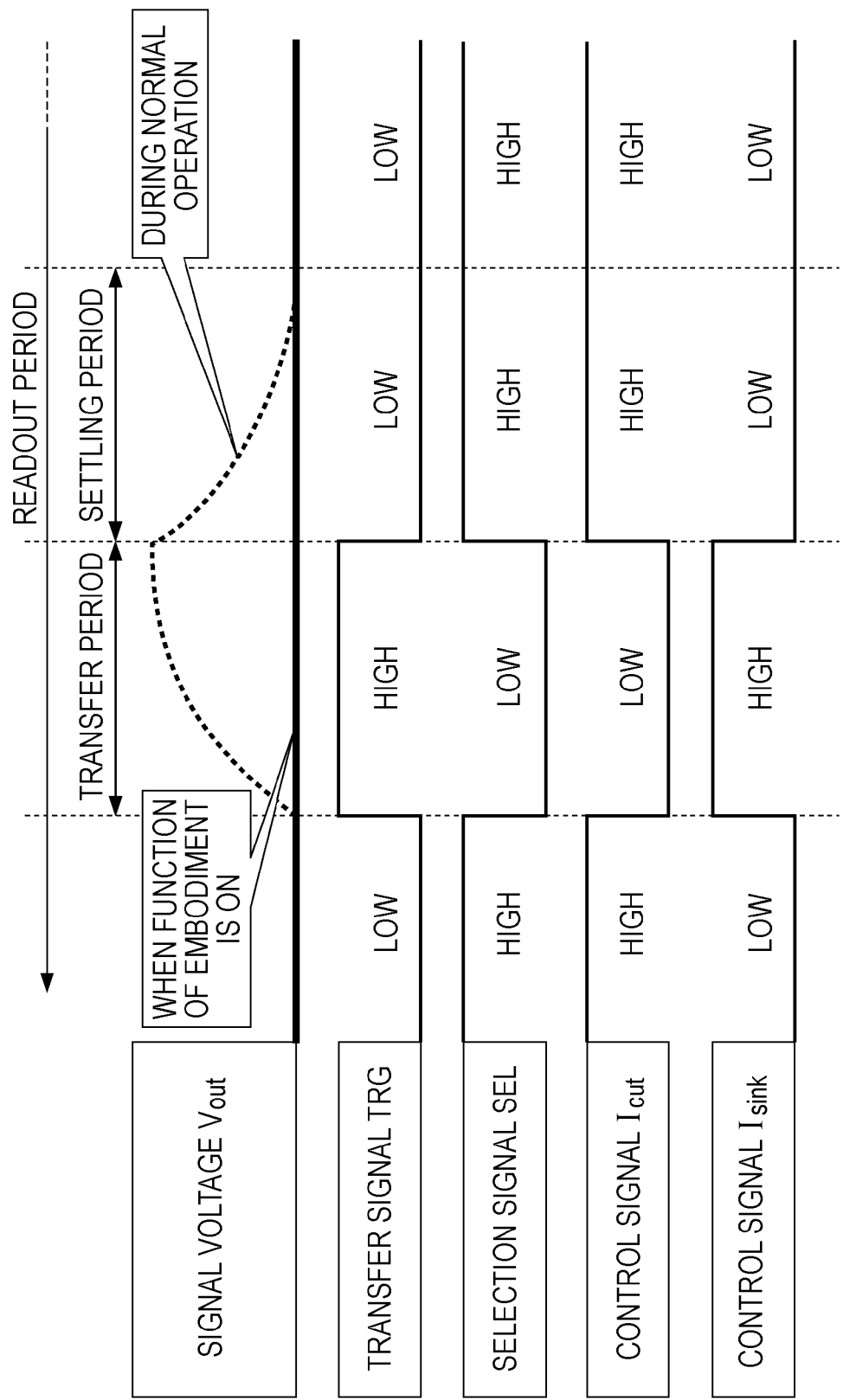

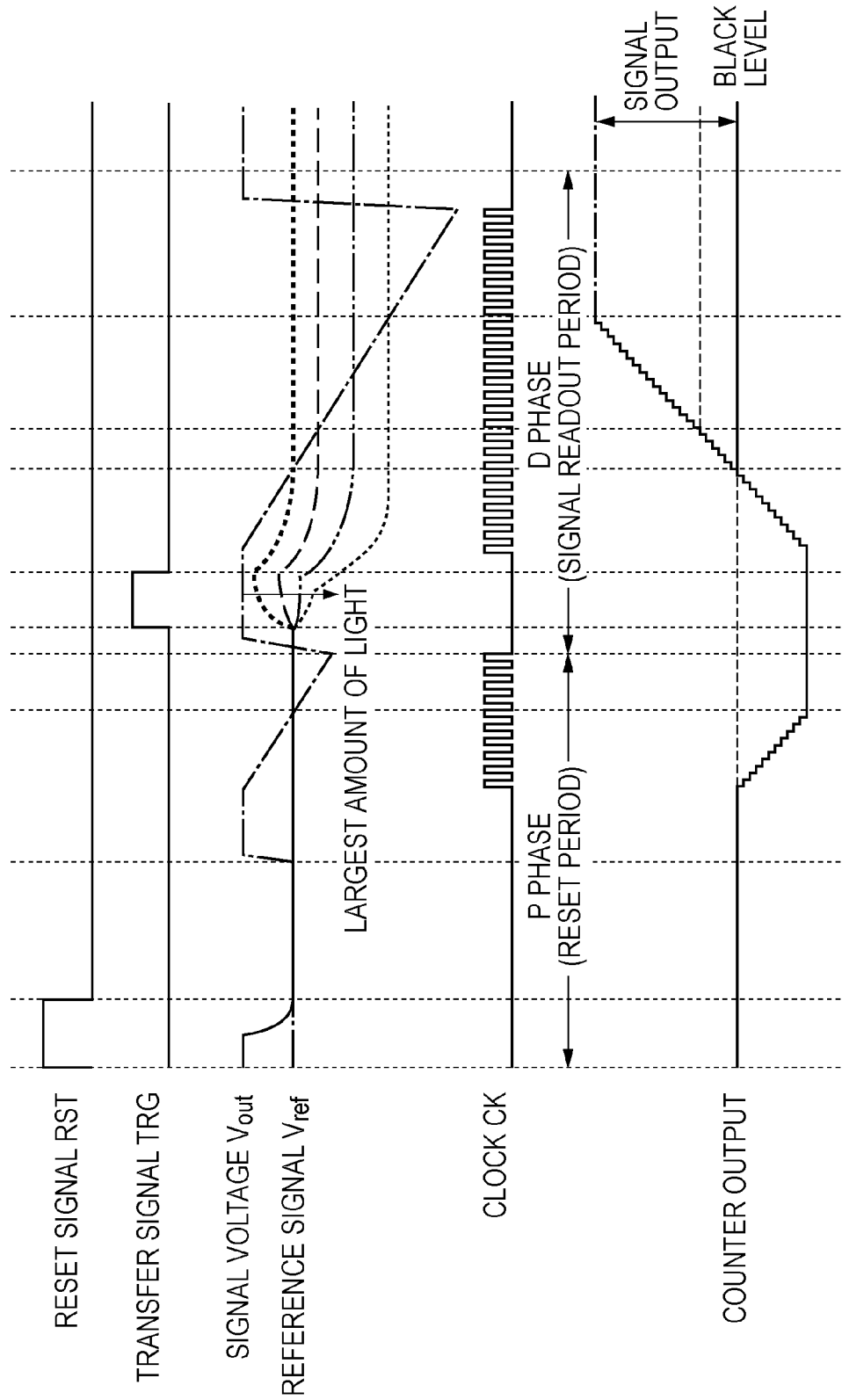

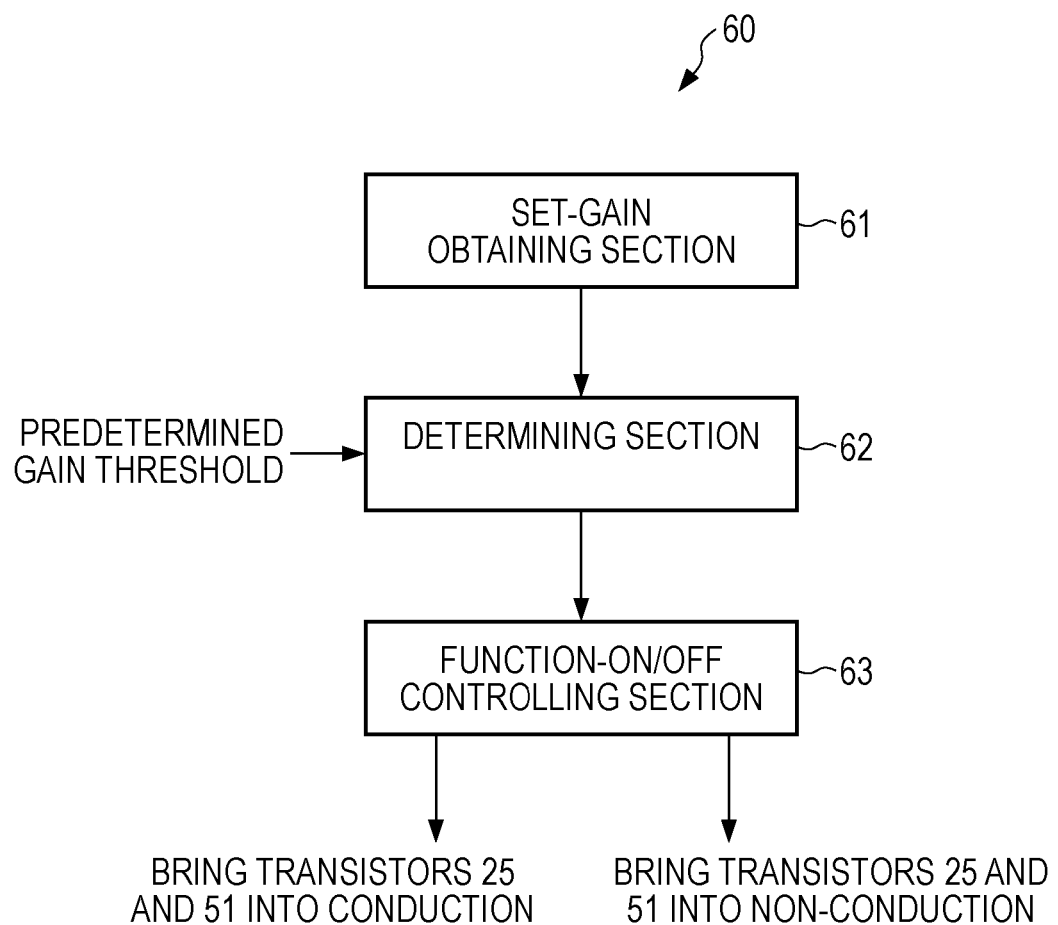

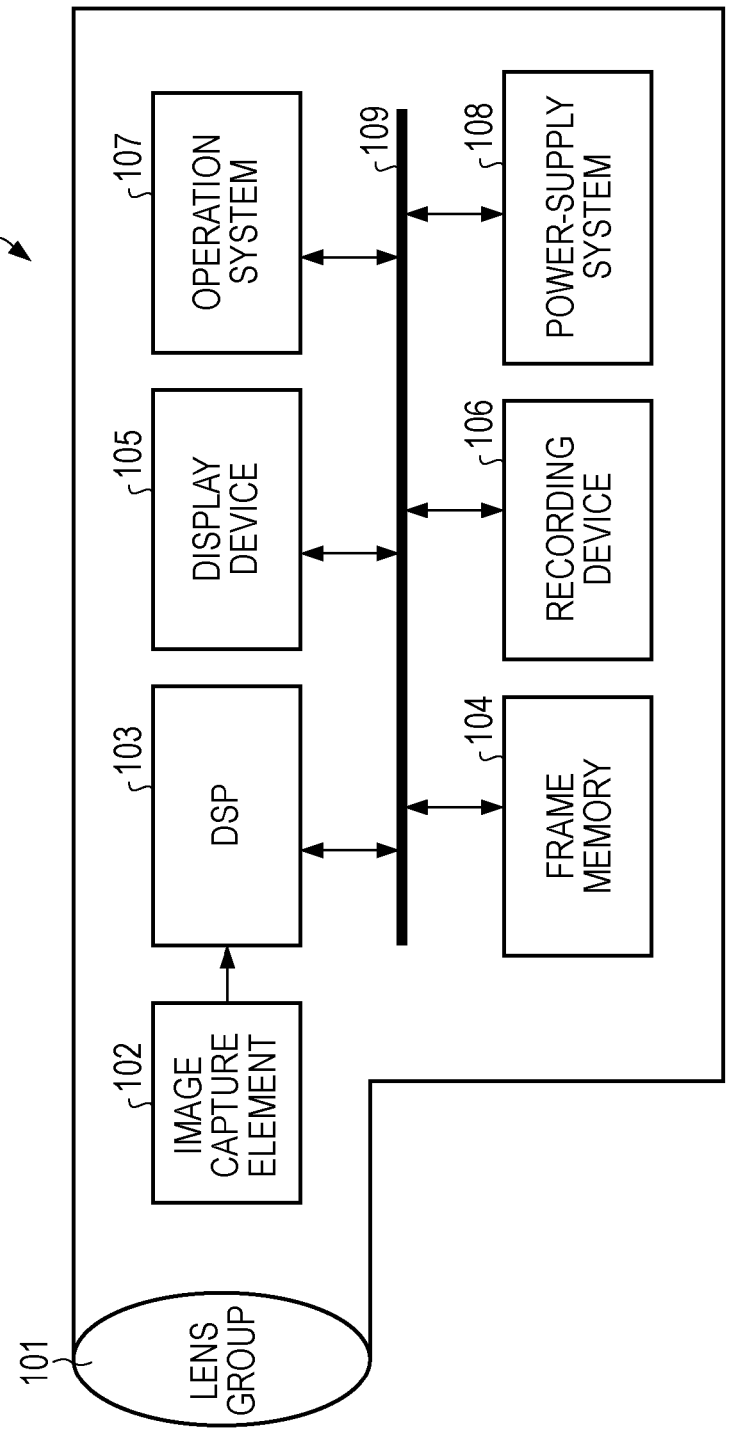

SOLID-STATE IMAGE CAPTURE DEVICE, DRIVE METHOD THEREFOR, AND ELECTRONIC APPARATUS

BACKGROUND

The present disclosure relates to a solid-state image capture device, a drive method therefor, and an electronic apparatus.

Solid-state image capture devices are used as digital still cameras and video cameras and further as image capture sections (or, image pickup sections) in electronic apparatuses, including mobile information terminals (e.g., mobile phones) having image-capture functions. The solid-state image capture devices can be broadly classified into charge-transfer solid-stage image capture devices, typified by CCD (charge-coupled device) image sensors, and amplification solid-state image capture devices, typified by CMOS (complementary metal oxide semiconductor) image sensors.

The charge-transfer solid-stage image capture devices basically have a configuration in which charges resulting from photoelectric conversion performed by the photoelectric converting sections are directly transferred in a packet relay manner and an output stage converts the charges into electrical signals. The amplification solid-stage image capture devices basically have a configuration in which charges resulting from photoelectric conversion performed by photoelectric converting sections are output to signal lines as electrical signals for respective pixels.

Some of the amplification solid-stage image capture devices, for example, the CMOS image sensors, perform analog-to-digital conversion (hereinafter referred to as "AD conversion") on analog signals for respective pixel columns, i.e., in column parallel, the analog signals being output from the respective pixels for each pixel row (see, e.g., Japanese Unexamined Patent Application Publication No. 2005-278135).

SUMMARY

In recent years, in conjunction with increased frame rates and an increased number of pixels of solid-state image capture devices, there have been high demands for higher readout speeds for reading signals from the pixels and lower power consumption of the solid-stage image capture devices. In amplification solid-stage image capture devices such as CMOS image sensors, some methods are available for achieving higher readout speeds. Examples of such methods include a method in which, for slope-type AD converters, the gradient of a slope is increased to increase the frequency of a counter for counting a time to thereby reduce the conversion time and a method in which the amount of current for use by a circuit is increased and a settling time (a transient response time) for stabilizing an input signal before the start of the slope is reduced. However, those methods cause an increase in the power consumption and thus are not suitable for reducing the power consumption.

Accordingly, it is desirable to provide a solid-state image capture device that is capable of increasing the readout speed without an increase in the power consumption, a drive method for the solid-state image capture device, and an electronic apparatus having the solid-stage image capture device as an image capture section (an image pickup section).

According to one embodiment of the present disclosure, there is provided a solid-state image capture device. The solid-stage image capture device has unit pixels including transfer gates that transfer charges to diffusion layers, the charges being obtained by photoelectric conversion performed by photoelectric converting sections; signal lines to which signals output from the unit pixels are read out; and current sources connected to the signal lines. In the solid-stage image capture device, connections between the unit pixels and the signal lines and the signal lines and the current sources are electrically cut off in a transfer period of the transfer gates.

The solid-state image capture device disclosed herein can be used as a digital still camera or a video camera or as an image capture section (or, an image pickup section) in an electronic apparatus, such as a mobile information terminal (e.g., a mobile phone) having an image-capture function.

A transfer pulse is applied to a gate electrode of the transfer gate to cause the operation period to enter a transfer period in which the charge obtained by the photoelectric converting section is transferred to the diffusion layer. In the transfer period, coupling due to a parasitic capacitance that is parasitic between the gate electrode and the diffusion layer causes the potential of the diffusion layer to vary. The variation in the potential of the diffusion layer also causes the potential of the signal line to vary. Consequently, a settling time (a transient response time) until the potential of the signal line is stabilized during readout of the signal from the unit pixel to the signal line increases.

Accordingly, in a transfer period, a connection between the unit pixel and the signal line and a connection between the signal line and the current source are electrically cut off. With this arrangement, the signal line enters a high-impedance state. Thus, even when the coupling causes the potential of the diffusion layer to vary in the transfer period, the potential of the signal line does not vary. As a result, it is possible to reduce the settling time of the potential of the vertical signal line during readout of the signal from the unit pixel to the signal line. Moreover, since the amount of current of the current source does not increase, the power consumption also does not increase.

According to the present disclosure, since the settling time of the potential of the signal line can be reduced without an increase in the amount of current of the current source, the readout speed can be increased without an increase in the power consumption.

BRIEF DESCRIPTION OF THE DRAWINGS

FIG. 9 is an operation diagram illustrating a circuit operation in the second embodiment;

FIG. 10 is a timing waveform diagram illustrating a variation in the potential of the vertical signal line, the variation being dependent on the amount of light;

FIG. 11 is a functional block diagram of a driver according to a third embodiment; and FIG. 12 is a block diagram illustrating an exemplary configuration of a solid-state image capture device according to one embodiment of the present disclosure.

DETAILED DESCRIPTION OF EMBODIMENTS

Figure 1:
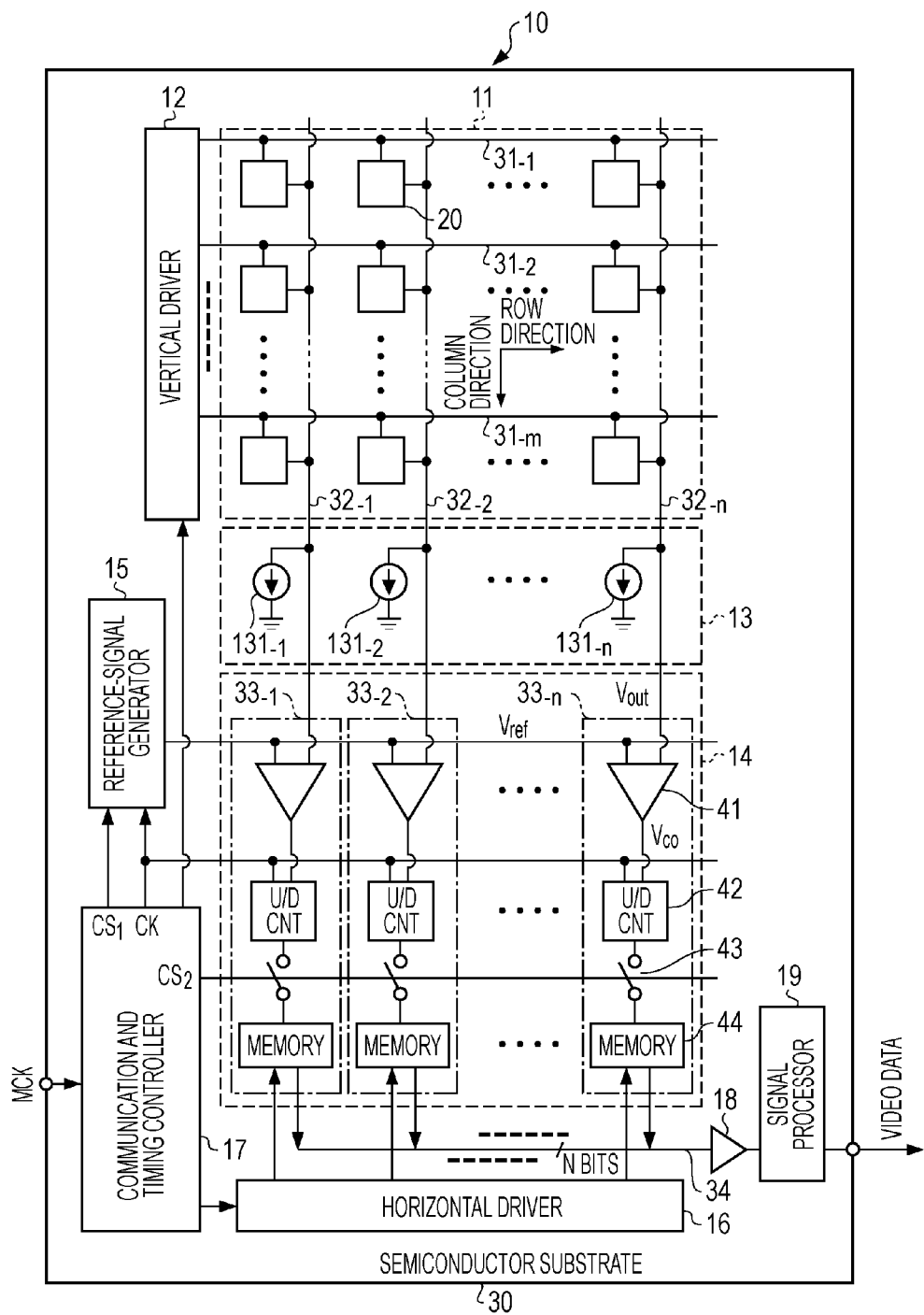
FIG. 1 is a block diagram illustrating one example of a system configuration of a CMOS image sensor having column-parallel AD conversion circuits to which the present technology is applied.

Modes (hereinafter referred to as "embodiments") for realizing the technology disclosed herein will be described below in detail with reference to the accompanying drawings. The present disclosure is not limited to the embodiments described below. In a description below, the same or similar elements or elements having the same or similar functions are denoted by the same reference numerals and redundant descriptions are not given hereinafter. A description below is given in the following order:

1. Overview of Solid-State Image Capture Device, Drive Method therefor, and Electronic Apparatus according to Embodiments of Present Disclosure
2. Embodiments
   2-1. System Configuration
   2-2. Exemplary Configuration of Pixel Circuit
   2-3. Basic Circuit Operation of Column Processor
   2-4. Problem Due to Insufficient Settling Period of Potentials of Vertical Signal Lines
   2-5. First Embodiment
   2-6. Second Embodiment
   2-7. Third Embodiment
3. Application Example
4. Electronic Apparatus (Image Capture Device)
5. Configuration in Present Disclosure 1. Overview of Solid-State Image Capture Device, Drive Method Therefor, and Electronic Apparatus According to Embodiments of Present Disclosure A solid-stage image capture device disclosed herein is directed to an amplification solid-stage image capture device, typified by a CMOS image sensor, having a configuration in which charges obtained by photoelectric conversion performed by photoelectric converting sections are output to signal lines as electrical signals for respective pixels. The solid-stage image capture device disclosed herein has unit pixels (which may simply be referred to as "pixels" hereinafter), each of which includes at least a transfer gate that transfers charge, obtained by the photoelectric conversion performed by the photoelectric converting section, to a diffusion layer. The diffusion layer converts the charge, transferred by the transfer gate, into a voltage.

Each unit pixel in the solid-stage image capture device disclosed herein may further include an amplification transistor that amplifies a signal converted into the voltage by the diffusion layer and a selection transistor selects the unit pixel that outputs a signal resulting from the amplification performed by the amplification transistor. The signal converted into the voltage by the diffusion layer may be amplified by the amplification transistor and the amplified signal may be output from the pixel, selected by the selection transistor, to the corresponding signal line. Preferably, a current source is connected to the signal line and constitutes a source follower circuit in conjunction with the amplification transistor through the signal line.

In each unit pixel, a transfer pulse may be applied to a gate electrode of the transfer gate to cause the operation period to enter a transfer period in which the charge obtained by the photoelectric converting section is transferred to the diffusion layer. The solid-state image capture device disclosed herein may have a driver that electrically cuts off a connection between the unit pixel and the signal line and a connection between the signal line and the current source in the transfer period during which the transfer gate transfer the charge.

In accordance with an amount of light incident on the photoelectric converting section, the driver may determine whether or not the connection between the unit pixel and the signal line and the connection between the signal line and the current source are to be electrically cut off. Preferably, when the amount of light incident on the photoelectric converting section is larger than a predetermined amount, the driver does not perform the electrical cutoff, and when the amount of light incident on the photoelectric converting section is smaller than or equal to the predetermined amount, the driver performs the electrical cutoff.

The driver may perform driving so that the connection between the unit pixel and the signal line and the connection between the signal line and the current source are electrically cut off in the transfer period. Consequently, the signal line enters a high-impedance state. Thus, even when coupling due to a parasitic capacitance that is parasitic between the gate electrode and the diffusion layer causes the potential of the diffusion layer to vary, the potential of the signal line does not vary. As a result, it is possible to reduce a settling time (a transient response time) until the potential of the signal line during readout of the signal from the unit pixel to the signal line is stabilized.

In each unit pixel, the selection transistor can be driven by the driver to bring the selection transistor into non-conduction (i.e., an off state), thereby making it possible to electrically cut off the connection between the unit pixel and the signal line. In this case, in terms of electrically cutting off the connection between the unit pixel and the signal line completely, it is preferable that the selection transistor be connected between the amplification transistor and the signal line.

However, the present disclosure is not intended to exclude a pixel configuration in which the selection transistor is connected between the amplification transistor and a power supply. When the selection transistor is provided between the power supply and the signal line and is connected in series with the amplification transistor, it is possible to perform an operation for selecting the pixel that outputs the signal resulting from the amplification performed by the amplification transistor.

A switching element may be connected between the signal line and the current source. In the transfer period during which the transfer gate transfers the charge, the switching element may be driven by the driver to electrically cut off the connection between the signal line and the current source. As a result, the signal line enters a high-impedance state. It is preferably that, when the connection between the signal line and the current source is electrically cut off, current be supplied to the current source through a path that is different from an electrical-current path from the signal line.

The solid-state image capture device disclosed herein may have a configuration including so-called "column-parallel AD conversion circuits, i.e., a configuration in which analog-to-digital conversion circuits for converting analog signals, read out from the unit pixels through the signal lines, into digital signals are provided for the respective signal lines. The configuration including the column-parallel AD conversion circuits is merely one example, and circuitry subsequent to the signal lines is not particularly limiting. Each column-parallel AD conversion circuit may include a comparing section that compares a slope-waveform (i.e., a ramp-waveform) reference signal with the corresponding analog signal from the pixel, the reference signal having a gradually changing level; and a counter section that performs a count operation on the basis of a result of the comparison performed by the comparing section. In accordance with a result of the count operation performed by the counter section, a digital signal corresponding to the analog signal from the pixel is obtained.

In the solid-stage image capture device having the column-parallel AD conversion circuits, the driver may compare a set-gain value with a predetermined gain threshold, the set-gain value defining a gradient of a level of the reference signal, and may determine whether or not the connection between the unit pixel and the signal line and the connection between the signal line and the current source are to be electrically cut off, in accordance with a result of the comparison. Preferably, when the set-gain value is larger than the predetermined gain threshold, the driver does not perform the electrical cutoff, and when the set-gain value is smaller than or equal to the predetermined gain threshold, the driver performs the electrical cutoff.

2. Embodiments

Before embodiments are described, a description will be given of the configuration of a solid-stage image capture device, for example, a CMOS image sensor having column-parallel AD conversion circuits, to which the technology disclosed herein is applied.

2-1. System Configuration

FIG. 1 is a block diagram illustrating one example of a system configuration of a CMOS image sensor having column-parallel AD conversion circuits to which the present technology is applied.

As illustrated in FIG. 1, a CMOS image sensor 10 according to this application example has a pixel array section 11, a driving system, and a signal processing system. In the pixel array section 11, unit pixels 20 including photoelectric converting sections are two-dimensionally arranged in a matrix. The driving system and the signal processing system drive the pixels 20 in the pixel array section 11.

In this example, the driving system is provided at a periphery of the pixel array section 11 and includes a vertical driver 12, a readout current source section 13, a column processor 14, a reference-signal generator 15, a horizontal driver 16, and a communication and timing controller 17. The signal processing system further includes, for example, an output amplifier 18 and a signal processor 19.

The driving system and the signal processing system, i.e., peripheral circuits of the pixel array section 11, are integrated on a semiconductor substrate (chip) 30 at which the pixel array section 11 is provided. Although all of peripheral circuits are integrated on the same semiconductor substrate 30 as that of the pixel array section 11 in this case, the present technology is not limited thereto. For example, it is also possible to employ a configuration in which one or some of the peripheral circuits, for example, the signal processor 19, is provided outside the semiconductor substrate 30.

In this system configuration, on the basis of a maser clock MCK, the communication and timing controller 17 generates clock signals and control signals that act as references for operations of the vertical driver 12, the column processor 14, the reference-signal generator 15, the horizontal driver 16, and so on. For example, the clocks signal and the control signals generated by the communication and timing controller 17 are supplied to the vertical driver 12, the column processor 14, the reference-signal generator 15, the horizontal driver 16, and so on as drive signals therefor.

The pixel array section 11 has a configuration in which the unit pixels 20 including the photoelectric converting sections are two-dimensionally arranged in column and row directions, i.e., in a matrix, as described above, and the photoelectric converting sections generate light charges corresponding to the amounts of incident light and accumulate the light charges. The "row direction" as used herein refers to a direction in which the unit pixels 20 in pixel rows are arranged (i.e., in a horizontal direction or a left-and-right direction) and the "column direction" as used herein refers to a direction in which the unit pixels 20 in pixel columns are arranged (i.e., in a vertical direction or an up-and-down direction). Details of a pixel circuit of the unit pixels 20 are described below.

The pixel array section 11 has a pixel array of m rows×n columns. In this pixel array, row control lines 31 ($31_{-1}$ to $31_{-m}$) are wired in the respective pixel rows along the row direction and vertical signal lines 32 ($32_{-1}$ to $32_{-n}$) are wired in the respective pixel columns along the column direction. A control signal for performing control for reading signals from the unit pixels 20 is transmitted through the row control lines 31. Although one line is illustrated as each of the row control lines 31 in FIG. 1, the number of lines therefor is not limited to one. First ends of the row control lines $31_{-1}$ to $31_{-m}$ are connected to output terminals corresponding to rows in the vertical driver 12.

The vertical driver 12 includes a shift register, an address decoder, and so on. The vertical driver 12 drives the unit pixels 20 in the pixel array section 11, for example, for each row. That is, the vertical driver 12, together with the communication and timing controller 17 that controls the vertical driver 12, constitutes a driver for driving the unit pixels 20 in the pixel array section 11. Although a specific configuration of the vertical driver 12 is not illustrated, it typically has two scanning systems, i.e., a readout scanning system and a sweep scanning system.

In the vertical driver 12, the sweep scanning system performs sweep scanning to sweep unwanted charges from the photoelectric converting sections in the unit pixels 20 in the readout row, thereby resetting the photoelectric converting sections. Through the unwanted-charge sweeping (resetting) performed by the sweep scanning system, the so-called "electronic shutter operation" is performed. The term "electronic shutter operation" as used herein refers to an operation for dumping light charges in the photoelectric converting sections and re-starting exposure (i.e., re-starting accumulation of light charges).

The readout scanning system performs a read operation to read signals corresponding to the amounts of light received immediately after the previous readout operation or the electronic shutter operation. A period from the readout timing of the previous readout operation or the sweep timing of the electronic shutter operation to the readout timing of the present readout operation is a light-charge exposure period of the unit pixels 20.

The readout current source section 13 has current sources 131 ($131_{-1}$ to $131_{-n}$), which are connected between the corresponding vertical signal lines $32_{-1}$ to $32_{-n}$ and a reference node (e.g., ground). The current sources $131_{-1}$ to $13_{-n}$ and corresponding amplification transistors 24 (described below), which are provided in the unit pixels 20, constitute source follower circuits through the vertical signal lines $32_{-1}$ to $32_{-n}$.

The column processor 14 has, for example, AD (analog-to-digital) conversion circuits 33 ($33_{-1}$ to $33_{-n}$), which are provided for the respective pixel columns, i.e., the vertical signal lines $32_{-1}$ to $32_{-n}$, in the pixel array section 11. The AD conversion circuits 33 ($33_{-1}$ to $33_{-n}$) convert analog signals (pixel signals), output from the unit pixels 20 in the pixel array section 11 for the respective pixel columns, into digital signals.

The reference-signal generator 15 generates a reference signal $V_{ref}$ having a level (a voltage value) that changes gradually in a stepped manner with time, i.e., having a ramp waveform (a slope waveform). In the reference-signal generator 15, a gain that defines the gradient of the reference signal $V_{ref}$ is set according to the amount of incident light. That is, a set-gain value that defines the gradient of the reference signal $V_{ref}$ varies according to the amount of incident light. The reference-signal generator 15 may be implemented by, for example, a DA (digital-to-analog) conversion circuit. The reference-signal generator 15 is not limited to an element using a DA conversion circuit.

Under the control of a control signal $CS_1$ supplied from the communication and timing controller 17, the reference-signal generator 15 generates the ramp-waveform reference signal $V_{ref}$ on the basis of a clock CK supplied from the communication and timing controller 17. The reference-signal generator 15 then supplies the generated reference signal $V_{ref}$ to the AD conversion circuits $33_{-1}$ to $33_{-n}$ in the column processor 14.

All of the AD conversion circuits $33_{-1}$ to $33_{-n}$ may have the same configuration. Now, a description will be given in conjunction with an example of the AD conversion circuit $33_{-n}$ in the nth column. The AD conversion circuit $33_{-n}$ includes, for example, a comparator 41, an up/down counter (denoted by "U/D CNT" in FIG. 1) 42 serving as a counter section, a transfer switch 43, and a memory section 44.

A signal voltage $V_{out}$ of the vertical signal line $32_{-n}$, the signal voltage $V_{out}$ corresponding to pixel signals output from the unit pixels 20 in the nth column in the pixel array section 11, and the ramp-waveform reference signal $V_{ref}$ supplied from the reference-signal generator 15 are input to the comparator 41. The comparator 41 compares the signal voltage $V_{out}$ (a comparison input) with the reference signal $V_{ref}$ (a reference input). For example, when the reference signal $V_{ref}$ is larger than the signal voltage $V_{out}$, an output $V_{co}$ of the comparator 41 reaches a first state (e.g., a high level), and when the reference signal $V_{ref}$ is smaller than or equal to the signal voltage $V_{out}$, the output $V_{co}$ of the comparator 41 reaches a second state (e.g., a low level).

The up/down counter 42 is an asynchronous counter. The clock CK is supplied from the communication and timing controller 17 to the up/down counter 42 at the same time when the reference signal $V_{ref}$ is output from the reference-signal generator 15. In synchronization with the clock CK, the up/down counter 42 performs a down count or an up count to measure a comparison period from the start to the end of the comparison operation of the comparator 41.

Under the control of a control signal $CS_2$ supplied from the communication and timing controller 17, the transfer switch 43 is turned on (i.e., is closed) when the up/down counter 42 completes the count operation with respect to the unit pixels 20 in one pixel row. The transfer switch 43 then transfers a result of the count operation of the up/down counter 42 to the memory section 44.

As described above, first, the comparators 41 in the AD conversion circuits $33_{-1}$ to $33_{-n}$ perform the comparison operations with respect to the analog signals that are read out, for the respective pixel columns, from the unit pixels 20 in the pixel array section 11 through the corresponding vertical signal lines $32_{-1}$ to $32_{-n}$. The up/down counters 42 perform the count operations during periods of time from the starts to the ends of the comparison operations of the corresponding comparators 41, to thereby convert the analog signals into digital signals, which are then stored in the memory sections 44 via the transfer switches 43.

The horizontal driver 16 includes shift registers, address decoders, and so on, and performs column-address control and column-scanning control for the AD conversion circuits $33_{-1}$ to $33_{-n}$ in the column processor 14. Under the control of the horizontal driver 16, the digital signals resulting from the AD conversion of the AD conversion circuits $33_{-1}$ to $33_{-n}$ are sequentially read out to a horizontal output line 34 as, for example, N-bit data.

The N-bit data read out to the horizontal output line 34 is amplified by the output amplifier 18 and the resulting N-bit data is supplied to the signal processor 19. The signal processor 19 performs predetermined signal processing on the N-bit data and outputs the resulting data to outside of the semiconductor substrate 30 as video data. The predetermined signal processing performed by the signal processor 19 may be processing for only buffering or may involve various types of digital-signal processing, such as adjusting a black level before buffering and correcting variations between the columns.

2-2. Exemplary Configuration of Pixel Circuit

Figure 2:
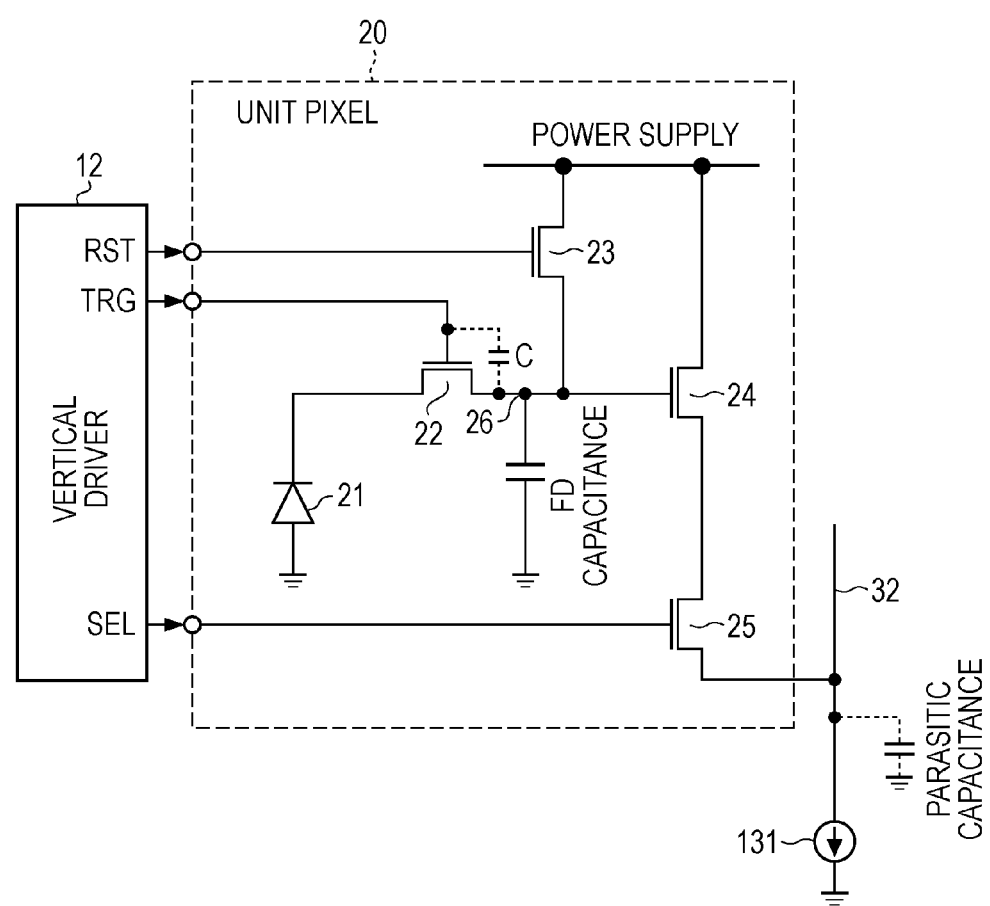
FIG. 2 is a circuit diagram illustrating an exemplary configuration of the pixel circuit of each unit pixel.

FIG. 2 is a circuit diagram illustrating an exemplary configuration of the pixel circuit of each unit pixel 20. As illustrated in FIG. 2, each unit pixel 20 according to this exemplary configuration has, for example, a photodiode 21 as the photoelectric converting section. In addition to the photodiode 21, the unit pixel 20 has, for example, a transfer transistor (a transfer gate) 22, a reset transistor 23, an amplification transistor 24, and a selection transistor 25.

In this example, the transfer transistor 22, the reset transistor 23, the amplification transistor 24, and the selection transistor 25 are implemented by, for example, n-channel MOS transistors. However, the exemplary combination of conductivity types of the transfer transistor 22, the reset transistor 23, the amplification transistor 24, and the selection transistor 25 is merely one example, and the combination of conductivity types is not limed thereto.

Multiple control lines are wired along all of the unit pixels 20 in the same pixel row as each of the row control lines 31 ($31_{-1}$ to $31_{-m}$). Illustration of the multiple control lines is omitted in FIG. 2, for simplicity thereof. The multiple control lines for each pixel row are connected to an output end corresponding to the pixel row in the vertical driver 12. For driving the unit pixels 20 in the pixel array section 11, the vertical driver 12 outputs a transfer signal TRG, a reset signal RST, and a selection signal SEL to the control lines, as appropriate.

The photodiode 21 has an anode electrode connected to a negative-side power supply (e.g., ground). The photodiode 21 photoelectrically converts received light into light charge (photoelectrons in this case) having the amount of charge corresponding to the amount of the received light and accumulates the light charge. The photodiode 21 has a cathode electrode electrically connected to a gate electrode of the amplification transistor 24 via the transfer transistor 22.

A charge-to-voltage converter (a diffusion layer) 26 is electrically connected to the gate electrode of the amplification transistor 24 to convert charge to a voltage. The charge-to-voltage converter 26 is hereinafter referred to as an "FD (floating diffusion) section 26".

The transfer transistor 22 is connected between the cathode electrode of the photodiode 21 and the FD section 26. The transfer signal TRG, which is active at a high level (hereinafter referred to as "high active"), is supplied from the vertical driver 12 to a gate electrode of the transfer transistor 22. In response to the transfer signal TRG, the transfer transistor 22 goes into conduction to thereby transfer the light charge, photoelectrically converted and accumulated by the photodiode 21, to the FD section 26.

The reset transistor 23 has a drain electrode connected to a power supply and a source electrode connected to the FD section 26. The reset transistor 23 has a gate electrode to which the reset signal RST, which is high active, is supplied from the vertical driver 12. In response to the reset signal RST, the reset transistor 23 goes into conduction to dump the charge in the FD section 26, thereby resetting the FD section 26.

The gate electrode of the amplification transistor 24 is connected to the FD section 26 and a drain electrode of the amplification transistor 24 is connected to the power supply. The amplification transistor 24 serves as an input section of the aforementioned source follower circuit, which is a readout circuit for reading a signal resulting from the photoelectric conversion performed by the photodiode 21. That is, since the source electrode of the amplification transistor 24 is connected to the corresponding vertical signal line 32 via the selection transistor 25, the amplification transistor 24, together with the current source 131 connected to one end of the vertical signal line 32, constitutes the source follower circuit.

For example, a drain electrode of the selection transistor 25 is connected to the source electrode of the amplification transistor 24 and a source electrode of the selection transistor 25 is connected to the vertical signal line 32. The reset selection signal SEL, which is active high, is supplied from the vertical driver 12 to a gate electrode of the selection transistor 25. In response to the selection signal SEL, the selection transistor 25 goes into conduction to thereby output a pixel signal, amplified by the amplification transistor 24 when the unit pixel 20 is selected, to the vertical signal line 32.

It is also possible to employ a circuit configuration in which the selection transistor 25 is connected between the drain electrode of the amplification transistor 24 and the power supply. That is, the selection transistor 25 is provided between the power supply and the vertical signal line 32 and is connected in series with the amplification transistor 24, so that the selection transistor 25 can perform an operation for selecting the unit pixel 20.

2-3. Basic Circuit Operation of Column Processor

Figure 3:
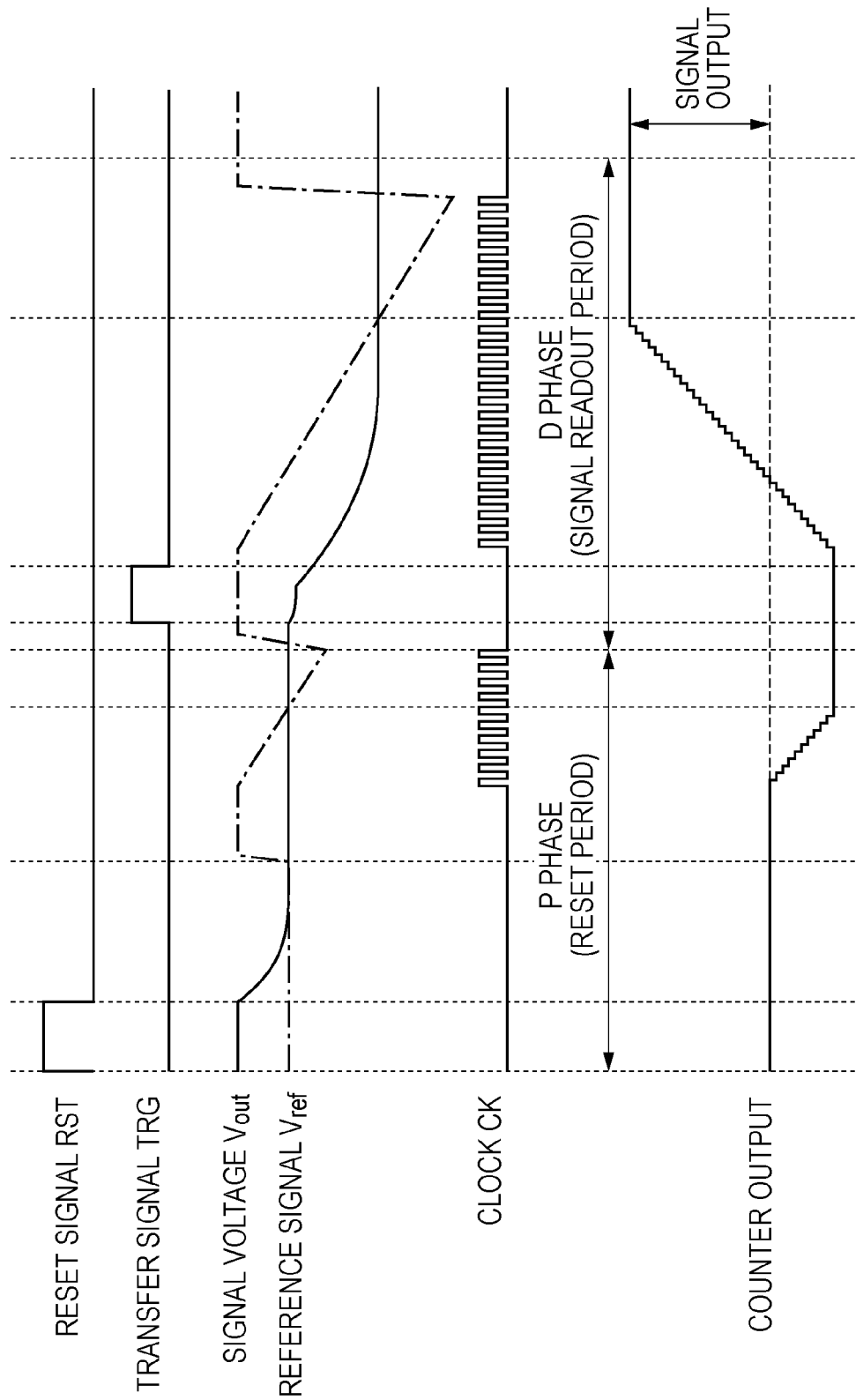
FIG. 3 is a timing waveform diagram illustrating a basic circuit operation of a column processor in the CMOS image sensor having the column-parallel AD conversion circuits.

A basic circuit operation of the column processor 14 in the CMOS image sensor 10 having the above-described configuration will now be described with reference to a timing waveform diagram illustrated in FIG. 3. FIG. 3 illustrates timing relationships of the reset signal RST, the transfer signal TRG, the signal voltages $V_{out}$ of the vertical signal lines $32_{-1}$ to $32_{-n}$, the reference signal $V_{ref}$, the clock CK, and the count outputs of the up/down counters 42.

In the unit pixels 20, the reset transistors 23 perform reset operations and the transfer transistors 22 perform transfer operations. In the reset operations, the potentials of the FD sections 26 when they are reset by the reset transistors 23 are output from the unit pixels 20 to the vertical signal lines $32_{-1}$ to $32_{-n}$ as reset components (P phase). In the transfer operations, the potentials of the FD sections 26 when the charges accumulated in the photodiodes 21 are transferred by the transfer transistors 22 are output to the vertical signal lines $32_{-1}$ to $32_{-n}$ as signal components (D phase).

After a first readout operation in which the signals are read out from the unit pixels 20 in a selected one of the rows to the vertical signal lines $32_{-1}$ to $32_{-n}$ is stabilized, the ramp-waveform reference signal $V_{ref}$ is supplied from the reference-signal generator 15 to the comparators 41, so that the comparators 41 perform comparison operations for comparing the corresponding signal voltages $V_{out}$ of the vertical signal lines $32_{-1}$ to $32_{-n}$ with the reference signal $V_{ref}$.

The clock CK is supplied from the communication and timing controller 17 to the up/down counters 42 at the same time when the reference signal $V_{ref}$ is supplied to the comparators 41, so that the up/down counters 42 perform down-count operations to measure the comparison times of the comparators 41 in the first readout operation. When the reference signal $V_{ref}$ and the signal voltages $V_{out}$ of the vertical signal lines $32_{-1}$ to $32_{-n}$ become equal to each other, the polarities of the outputs $V_{co}$ of the comparators 41 are reversed from high levels to low levels. In response to the polarity reversals of the outputs $V_{co}$ of the comparators 41, the up/down counters 42 stop the down-count operations and hold count values corresponding to a first comparison period of the comparators 41.

In the first readout operation, reset components ΔV of the unit pixels 20 are read. The reset components ΔV include fixed-pattern noise as noise, the noise varying from one pixel 20 to another.

In a second readout operation, an operation that is similar to the first readout operation of the reset components ΔV is performed to read out, in addition to the reset components ΔV, signal components $V_{sig}$ corresponding to the amounts of light incident on the respective unit pixels 20. Thus, after the second readout operation in which the signals are read out from the unit pixels 20 in the selected row to the vertical signal lines $32_{-1}$ to $32_{-n}$ is stabilized, the reference signal $V_{ref}$ is supplied from the reference-signal generator 15 to the comparators 41 in the AD conversion circuits $33_{-1}$ to $33_{-n}$, so that the comparators 41 perform comparison operations for comparing the corresponding signal voltages $V_{out}$ of the vertical signal lines $32_{-1}$ to $32_{-n}$ with the reference signal $V_{ref}$. At the same time, the up/down counters 42 perform up-count operations, which are different from the down-count operations in the first comparison operation, to measure second comparison times of the comparators 41.

As described above, each of the up/down counters 42 performs the down-count operation in the first count operation and performs the up-count operation in the second count operation. Thus, each of the up/down counters 42 performs processing for automatically subtracting the first comparison period from the second comparison period. When the reference signal $V_{ref}$ and the signal voltages $V_{out}$ of the vertical signal lines $32_{-1}$ to $32_{-n}$ become equal to each other, the polarities of the outputs $V_{co}$ of the comparators 41 are reversed, and in response to the polarity reversals, the up/down counters 42 stop the count operations. As a result, the up/down counters 42 hold count values corresponding to results obtained by subtracting the first comparison period from the second comparison period.

In the above-described second readout operation and the subtraction processing performed by the up/down counters 42 in the column processor 14, the reset levels and the signal levels of the unit pixels 20 are AD-converted independently of each other and CDS (correlated double sampling) processing is performed in a digital region. As a result of the AD conversion in the series of AD conversion operations, N-bit digital values (digital signals) are obtained. The horizontal driver 16 performs driving, so that the N-bit digital values are read out to the horizontal output line 34, which has a width of N bits, and are sequentially output via the output amplifier 18 and the signal processor 19.

Figure 4:
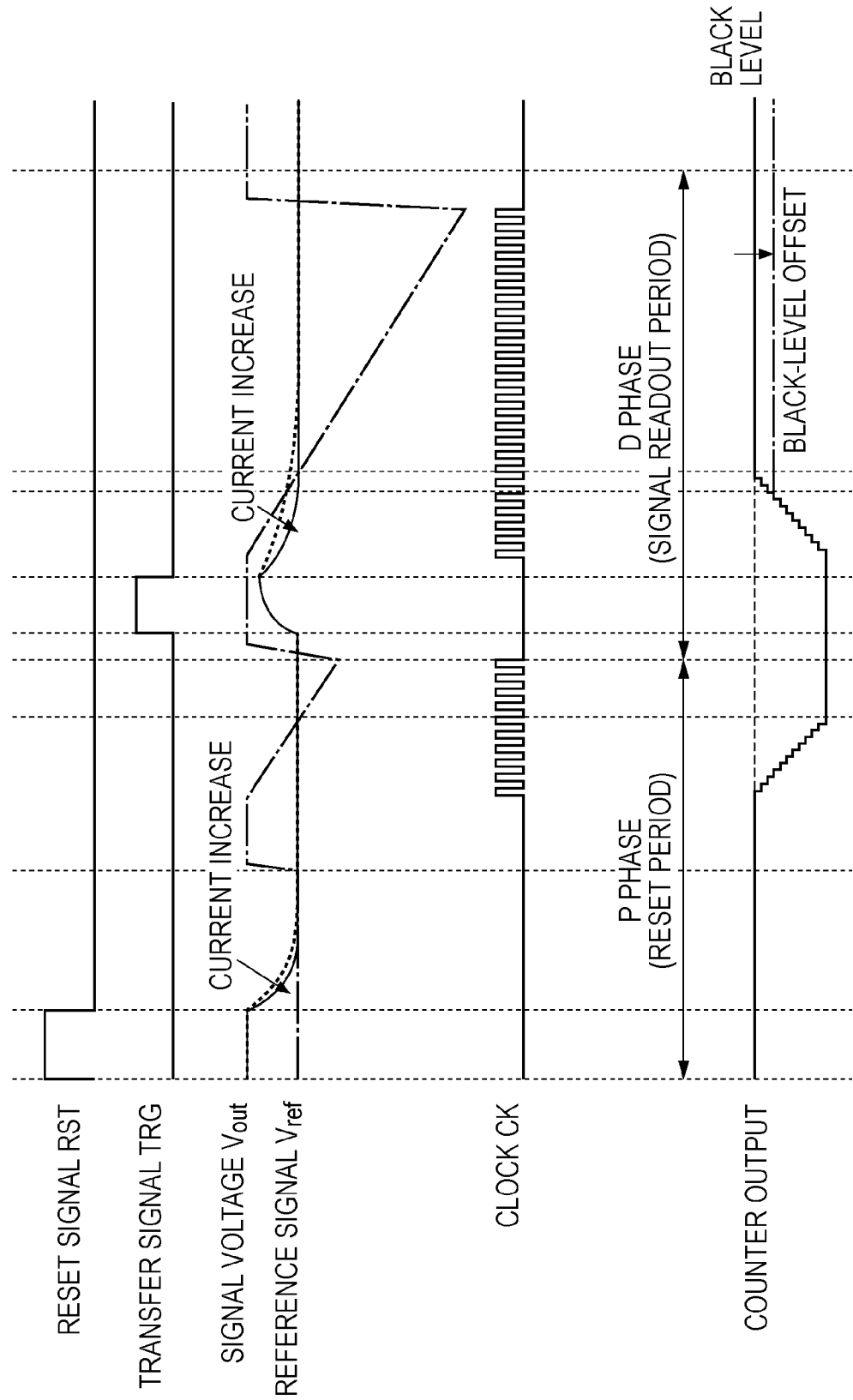
FIG. 4 is a timing waveform diagram illustrating a settling time (a transistor response time) of potentials of vertical signal lines during readout of signals.

2-4. Problem Due to Insufficient Settling Period of Potentials of Vertical Signal Lines Now, a settling time (a transient response time) that is a time until the potentials of the vertical signal lines $32_{-1}$ to $32_{-n}$ during readout of signals from the unit pixels 20 to the vertical signal lines $32_{-1}$ to $32_{-n}$ are stabilized will be described with reference to a timing waveform diagram illustrated in FIG. 4. FIG. 4 illustrates timing relationships of the reset signal RST, the transfer signal TRG, the signal voltages $V_{out}$ of the vertical signal lines $32_{-1}$ to $32_{-n}$, the reference signal $V_{ref}$, the clock CK, and the count outputs of the up/down counters 42.

During readout of pixel signals from the unit pixels 20 to the vertical signal lines $32_{-1}$ to $32_{-n}$, the drive signal TRG is supplied to the gate electrodes of the transfer transistors 22, so that the coupling due to parasitic capacitances C (see FIG. 2) that are parasitic between the gate electrodes of the transfer transistors 22 and the FD sections 26 cause the potentials of the FD sections 26 to vary. As a result of the variations in the potentials of the FD sections 26, the potentials of the vertical signal lines $32_{-1}$ to $32_{-n}$ also vary. Thus, after the transfer signal TRG changes from the high level to the low level, the settling of the potentials of the vertical signal lines $32_{-1}$ to $32_{-n}$ is started.

Consequently, in low light conditions where the amount of incident light is smaller than or equal to a predetermined amount of light, the amount of time until the signal voltages $V_{out}$ of the vertical signal lines $32_{-1}$ to $32_{-n}$ and the reference signal $V_{ref}$ cross each other is reduced. This yields a period in which the potentials of the vertical signal lines $32_{-1}$ to $32_{-n}$, are not stabilized, i.e., a so-called "insufficient settling period" of the potentials of the vertical signal lines $32_{-1}$ to $32_{-n}$. This insufficient settling period causes, for example, a problem in that a black level is offset from the original black level (this phenomenon is hereinafter referred to as "black-level offset"), as illustrated in FIG. 4.

When time is allowed, it is possible to increase the settling time of the potentials of the vertical signal lines $32_{-1}$ to $32_{-n}$. On the other hand, when time is constraint, for example, measures such as increasing the amounts of currents for the current sources $131_{-1}$ to $131_{-n}$ connected to the vertical signal lines $32_{-1}$ to $32_{-n}$ are taken in order to address the insufficient settling period. However, when all of the amounts of currents of the current sources $131_{-1}$ to $131_{-n}$ provided for the respective pixel columns are increased, the power consumption increases. This makes it difficult to reduce the power consumption.

The present embodiment is aimed to overcome the problems of the black-level offset and the power-consumption increase due to the insufficient settling period of the potentials of the vertical signal lines and to realize high-speed readout in solid-state image capture devices, such as the CMOS image sensor 10 having the above-described column-parallel AD conversion circuits. Specific embodiments will be described below.

2-5. First Embodiment

Figure 5:
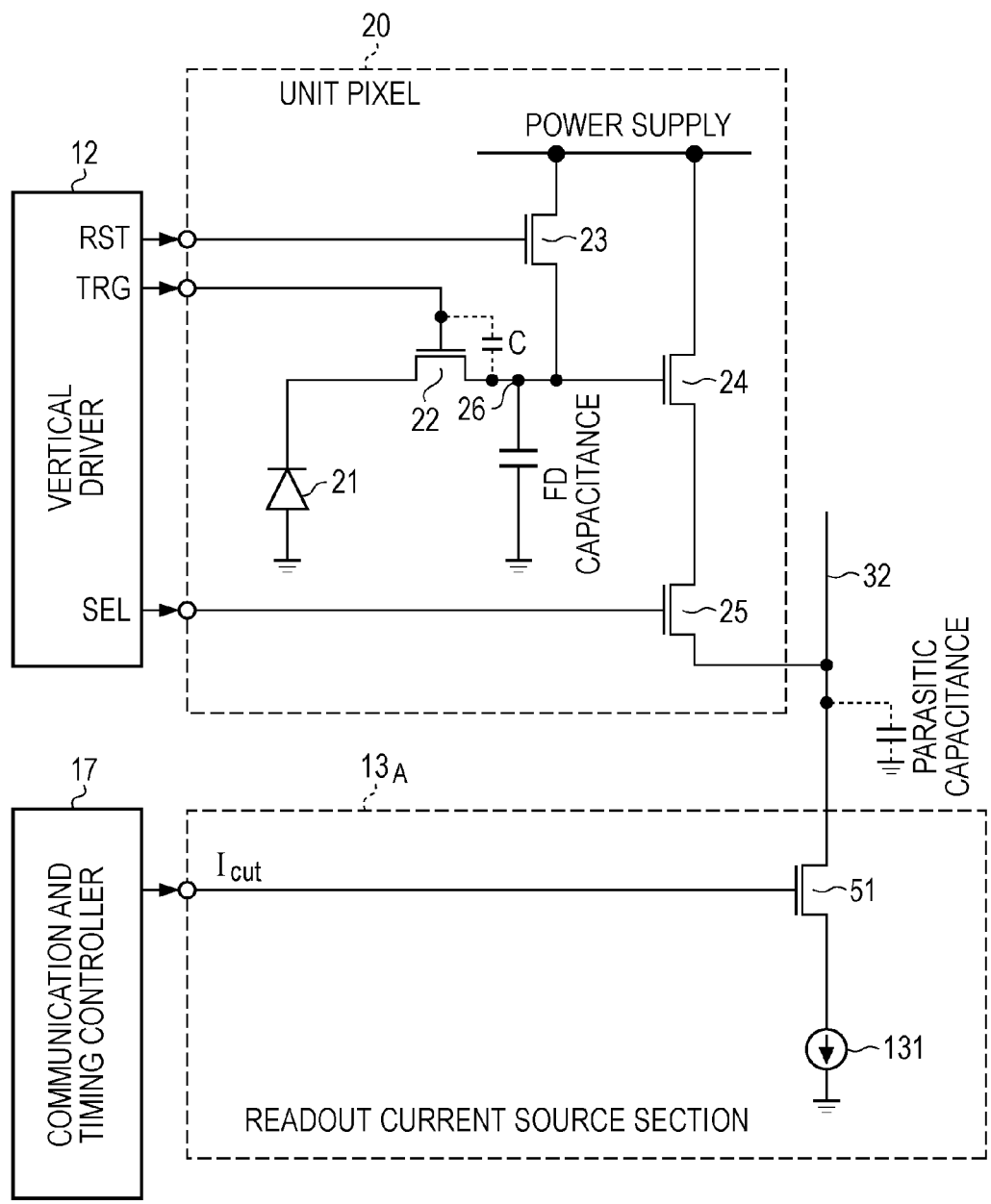
FIG. 5 is a circuit diagram illustrating the configuration of a unit pixel and a readout current source section in the CMOS image sensor according to a first embodiment.

FIG. 5 is a circuit diagram illustrating the configuration of a unit pixel and a readout current source section in the CMOS image sensor 10 according to a first embodiment.

The pixel circuit of a unit pixel 20 illustrated in FIG. 5 may have the same configuration as the pixel circuit of the unit pixel 20 illustrated in FIG. 2. The first embodiment features the drive timing of the vertical driver 12 and the configuration of a readout current source section $13_A$. More specifically, the readout current source section $13_A$ has a configuration in which switching elements are connected between the vertical signal lines 32 ($32_{-1}$ to $32_{-n}$) and the current sources 131 ($131_{-1}$ to $131_{-n}$). The switching elements are, for example, current-source cutoff transistors 51.

For example, a control signal $I_{cut}$ is selectively supplied from the communication and timing controller 17 to the gate electrodes of the current-source cutoff transistors 51. Under the control of the control signal $I_{cut}$, the current-source cutoff transistors 51 electrically cut off the connections between the vertical signal lines 32 ($32_{-1}$ to $32_{-n}$) and the current sources 131 ($131_{-1}$ to $131_{-n}$).

Figure 6:
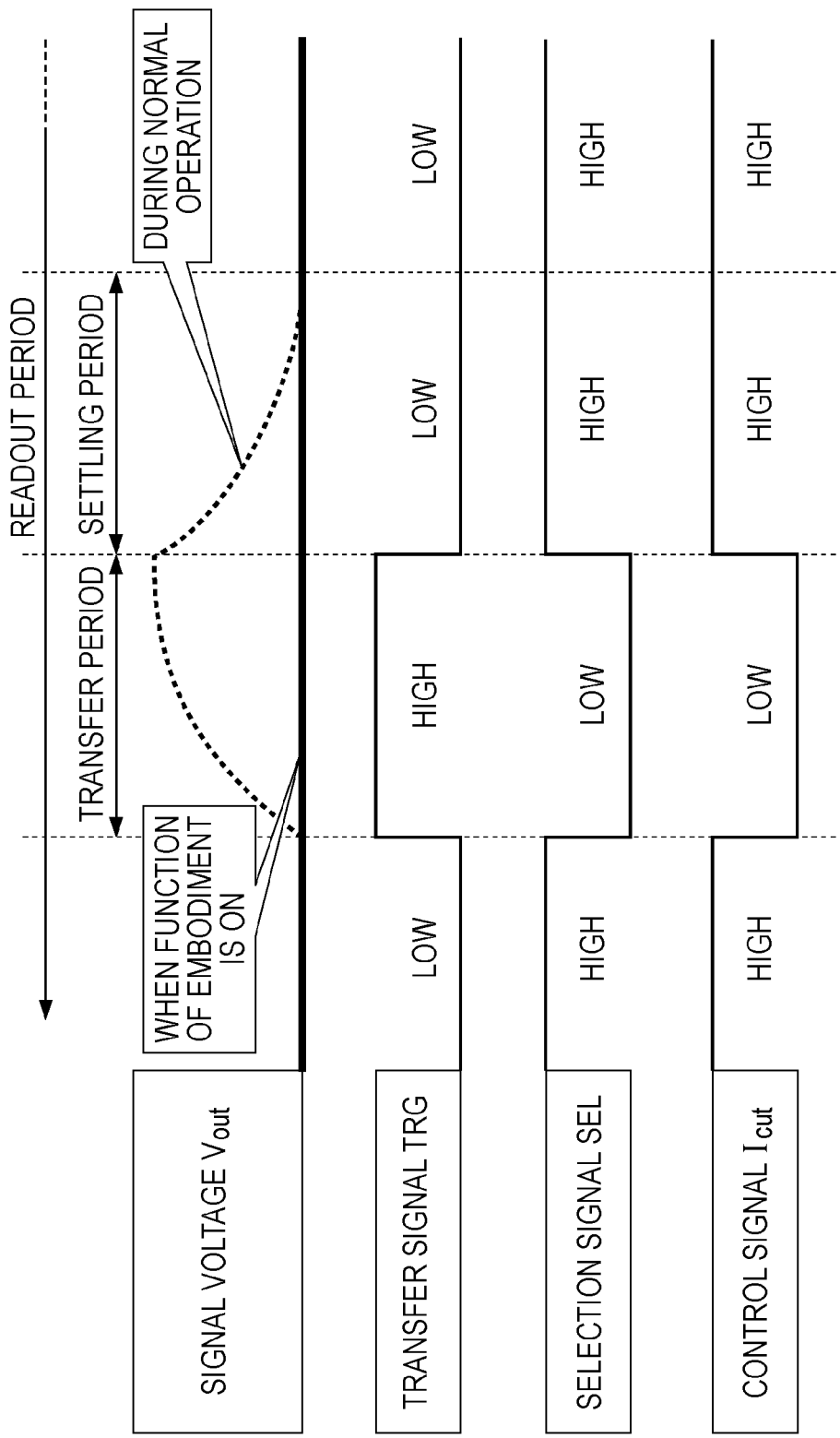
FIG. 6 is an operation diagram illustrating a circuit operation in the first embodiment.

A circuit operation having the above-described configuration according to the first embodiment will be described next with reference to an operation diagram illustrated in FIG. 6.

In a transfer period in the readout period of the pixel signals from the unit pixels 20, i.e., in a period in which the transfer signal TRG supplied to the transfer transistor 22 is at the high level, the vertical driver 12 changes the level of the selection signal SEL to the low level to bring the selection transistors 25 into non-conduction (i.e., into off states). At the same, in the transfer period of the transfer transistors 22, the communication and timing controller 17 changes the level of the control signal $I_{cut}$ to the low level to bring the current-source cutoff transistors 51 into non-conduction.

Thus, in the transfer period of the transfer transistors 22, the connections between the unit pixels 20 and the vertical signal lines 32 ($32_{-1}$ to $32_{-n}$) and the connections between the vertical signal lines 32 ($32_{-1}$ to $32_{-n}$) and the current sources 131 ($131_{-1}$ to $131_{-n}$) are electrically cut off. As is apparent from the above description of the operations, the vertical driver 12 and the communication and timing controller 17 constitute a driver that electrically cuts off the connections between the unit pixels 20 and the vertical signal lines 32 and the connections between the vertical signal lines 32 and the current sources 131.

Figure 7:
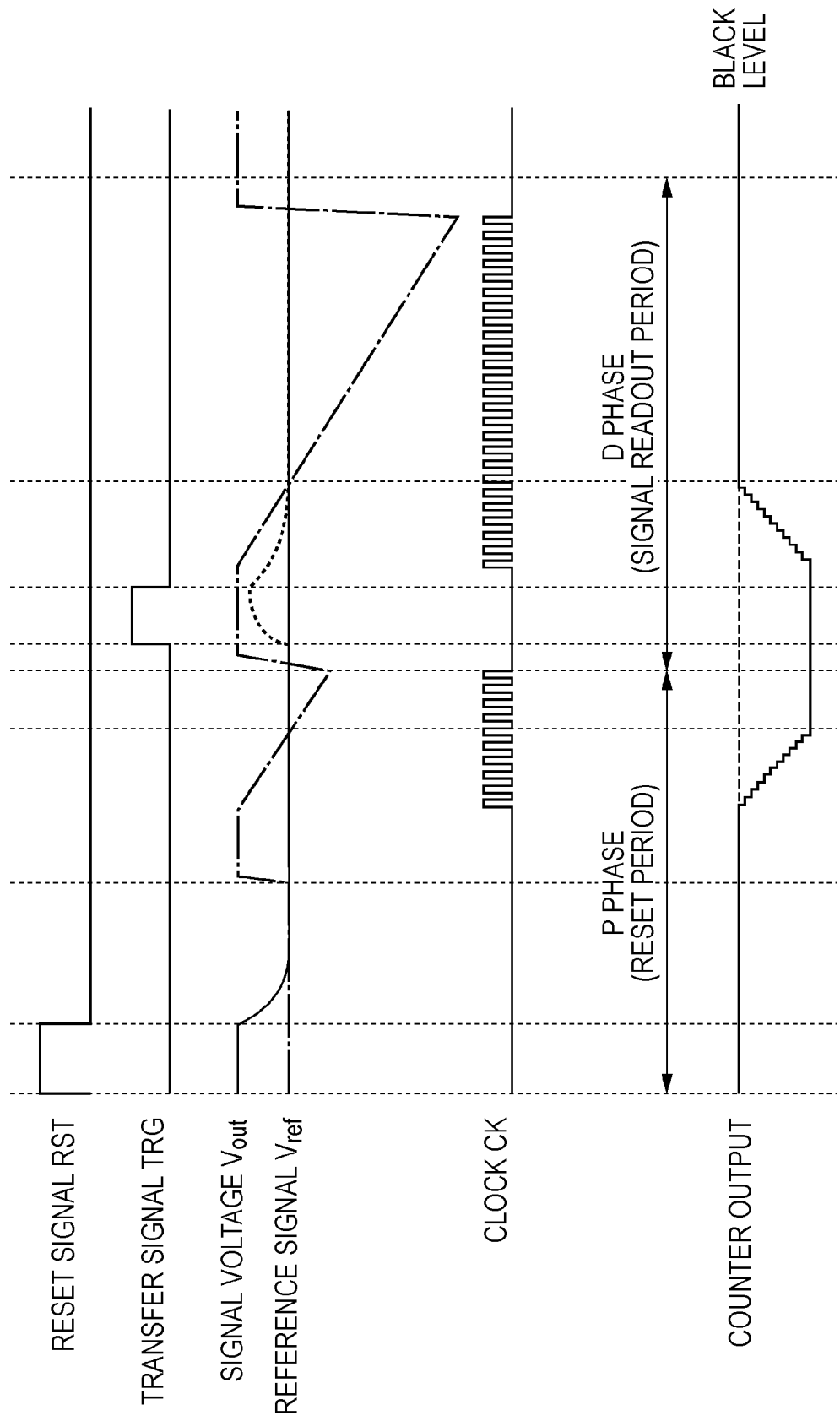
FIG. 7 is a timing waveform diagram illustrating a circuit operation in the first embodiment.

When the connections between the unit pixels 20 and the vertical signal lines 32 and the connections between the vertical signal lines 32 and the current sources 131 are electrically cut off in the transfer period of the transfer transistors 22, the vertical signal lines 32 enter high-impedance states. Accordingly, even when the coupling in the transfer period causes variations in the potentials of the FD sections 26, the variations do not influence the potentials of the vertical signal lines 32. Thus, the potentials (the signal voltages) $V_{out}$ of the vertical signal lines 32 can be maintained constant, as illustrated in FIG. 7.

As a result, it is possible to reduce the settling time of the potentials of the vertical signal lines 32 during readout of signals from the unit pixels 20 to the vertical signal lines 32. Moreover, since the settling time can be reduced without an increase in the amounts of currents of the current sources 131, the readout speed can be increased without an increase in the amounts of currents consumed. In addition, since the settling time can be reduced, the amounts of currents of the current sources 131 can be reduced when time is allowed. Thus, it is possible to reduce the power consumption.

2-6. Second Embodiment

Figure 8:
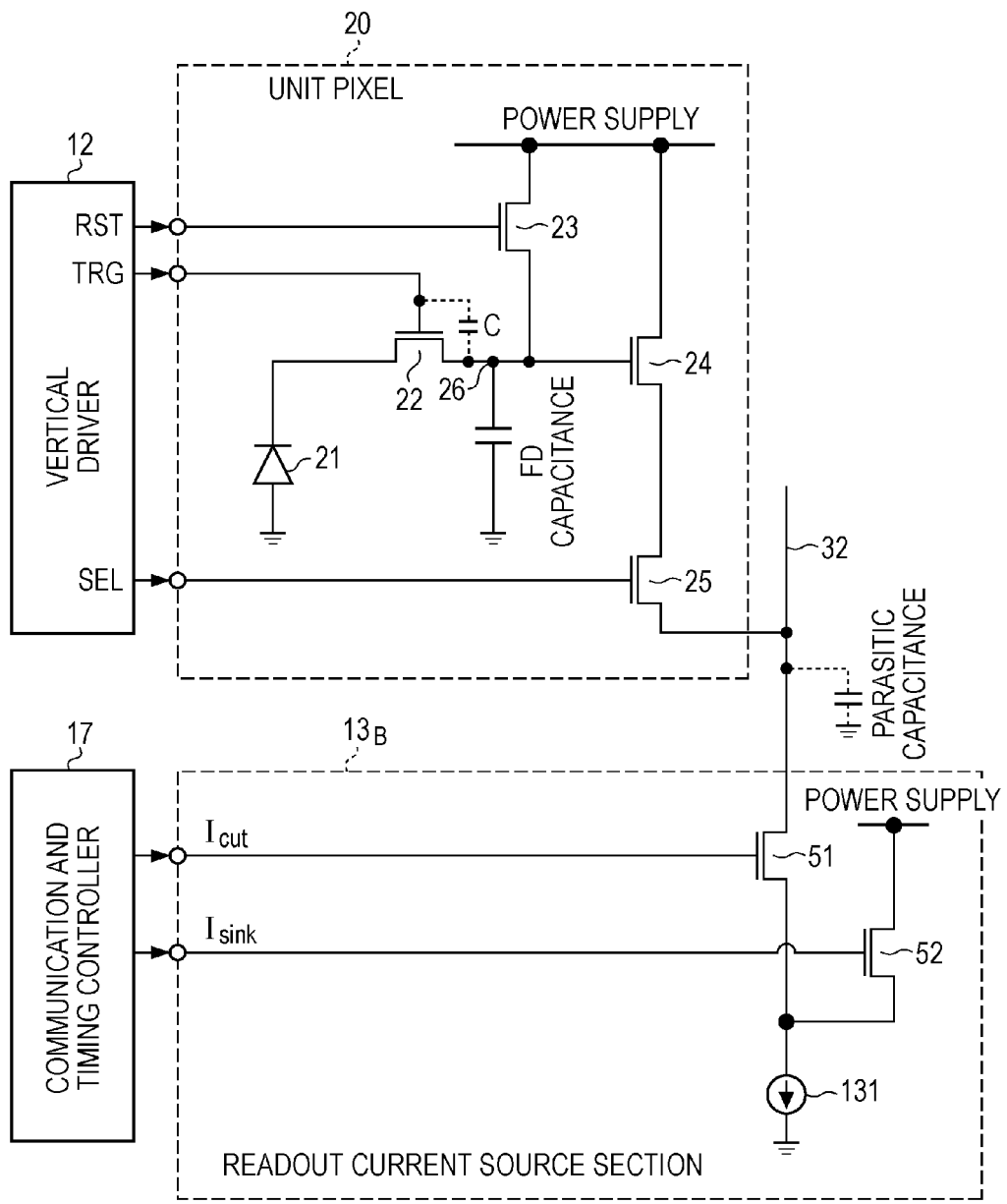
FIG. 8 is a circuit diagram illustrating the configuration of a unit pixel and a readout current source section in the CMOS image sensor according to a second embodiment.

FIG. 8 is a circuit diagram illustrating the configuration of a unit pixel and a readout current source section in a CMOS image sensor 10 according to a second embodiment.

As described above, the readout current source section $13_A$ according to the first embodiment has a configuration in which the current-source cutoff transistors 51 are connected between the vertical signal lines 32 and the current sources 131 to electrically cut off the connections between the vertical signal lines 32 and the current sources 131 when the connections between the unit pixels 20 and the vertical signal lines 32 are electrically cut off. In contrast, a readout current source section $13_B$ according to the second embodiment has a configuration having a switching element connected between the power supply and an input end of the current source 131, in addition to the current-source cutoff transistor 51. The switching element in this case is, for example, a current supply transistor 52.

For example, a control signal $I_{sink}$ is selectively supplied from the communication and timing controller 17 to a gate electrode of the current supply transistor 52 in the transfer period of the transfer transistor 22. Under the control of the control signal $I_{sink}$, the current supply transistor 52 goes into conduction to supply current from the power supply to the current source 131, in the transfer period of the transfer transistor 22, i.e., when the connection between the vertical signal line 32 and the current source 131 is electrically cut off. That is, the current supply transistor 52 serves as a current supply section that supplies current to the current source 131 through a path that is different from the electrical-current path from the vertical signal line 32.

An operation and an advantage of the current supply transistor 52 will be described next.

In the transfer period of the transfer transistors 22, the vertical signal lines 32 are electrically disconnected from the current sources 131 by operations of the current-source cutoff transistors 51. When the operation period changes from the transfer period to the settling period, the current-source cutoff transistors 51 go into conduction to thereby cause currents to flow to the current sources 131 again through the electrical-current paths from the vertical signal lines 32.

The CMOS image sensor 10 has a system configuration in which the current sources $131_{-1}$ to $131_{-n}$ are provided for the respective pixels columns. Thus, when the operation period changes from the transfer period to the settling period, currents flow to the current sources $131_{-1}$ to $131_{-n}$ in all of the pixel columns at once and thus the ground potential fluctuates. The fluctuation in the ground potential can adversely affect the image quality.

Accordingly, in the transfer period of the transfer transistors 22, i.e., when the connections between the vertical signal lines 32 and the current sources 131 are electrically cut off, the level of the control signal $I_{sink}$ is changed to a high level to bring the current-source cutoff transistors 51 into conduction, as illustrated in FIG. 9. As a result, currents are supplied to the current sources 131 through paths that are different from the electrical-current paths from the vertical signal lines 32, i.e., through the current-source cutoff transistors 51. With this arrangement, the fluctuation in the ground potential when the operation period changes from the transfer period to the settling period can be reduced, so that the settling time can be reduced and thus the readout speed can be increased without an adverse effect on the image quality.

As described above, according to the second embodiment, in addition to the operation and advantage of the first embodiment, i.e., in addition to the operations and advantage that allow for a reduction in the settling time of the potentials of the vertical signal lines 32, it is possible to reduce the fluctuation in the ground potential when the operation period changes from the transfer period to the settling period. It is, therefore, possible to achieve high-speed reading that does not affect the image quality.

2-7. Third Embodiment

As is apparent from the waveform of the signal voltage $V_{out}$ in FIG. 10, the amount of variation in the potential of the vertical signal line 32, the variation being induced by the coupling due to the parasitic capacitance C between the gate electrode of the transfer transistor 22 and the FD section 26 in the transfer period, has a smaller influence on the settling, as the amount of incident light increases. For example, if the coupling causes the potential of the vertical signal line 32 to be offset by about 100 mV when the transfer signal TRG is turned on during readout of a zero amount of signal, then a settling time in which the potential of the vertical signal line 32 is returned to its original value by about 100 mV is taken from when the transfer signal TRG is turned off. Consequently, the amount of time until the stabilization increases. According to the first and second embodiments, the influence of the coupling can be eliminated or significantly reduced when the transfer signal TRG is turned on, so that the stabilization time from when the transfer signal TRG is turned off can be eliminated or significantly reduced.

However, the potential of the vertical signal line 32 can vary from the moment when the transfer signal TRG is turned on during readout of a signal with a signal amount of 500 mV, and therefore, when it is assumed that the transfer signal TRG can be varied by 500 mV when the transfer signal TRG is turned off, an amount of time for reading a signal with a signal amount of 100 mV that is varied by the remaining coupling is sufficient. Consequently, the settling time is reduced compared to a case in which a signal of 500 mV is read when the transfer signal TRG is turned off. When the function of the first or second embodiment described above is performed, the potential of the vertical signal line 32 can be maintained constant in the transfer period. Thus, when the amount of light is large, the settling time of the potential of the vertical signal line 32 is increased by an amount corresponding to the transfer period at a maximum.

Accordingly, in the third embodiment, a determination as to whether or not the function of the first or second embodiment is to be performed, i.e., a determination as to whether or not the connection between the unit pixel 20 and the vertical signal line 32 and the connection between the vertical signal line 32 and the current source 131 are to be electrically cut off, is made according to the amount of light incident on the unit pixel 20 (the photodiode 21). More specifically, when the amount of incident light is larger than a predetermined amount of light, the electrical cutoff is not performed, and when the amount of incident light is smaller than or equal to the predetermined amount of light, the electrical cutoff is performed. The communication and timing controller 17 or a controller (not illustrated) that controls the communication and timing controller 17 performs driving according to the third embodiment.

The CMOS image sensor 10 to which the technology disclosed herein is applied has column-parallel AD conversion circuits (see FIG. 1). As described above, in the reference-signal generator 15 that generates the reference signal $V_{ref}$ for use in the column processor 14, the gain that defines the gradient of the reference signal $V_{ref}$ changes according to the amount of incident light. The amount of incident light can be determined based on the set-gain value that defines the gradient of the reference signal $V_{ref}$.

Accordingly, in the third embodiment, as one example, a determination as to whether or not the function of the first or second embodiment is to be performed is made based on the set-gain value that defines the gradient of the reference signal $V_{ref}$. A specific example for performing the function of the third embodiment will be described below with reference to FIG. 11. FIG. 11 is a functional block diagram of a driver (e.g., the communication and timing controller 17) that performs the function of the third embodiment.

In FIG. 11, a driver 60 that performs the function of the third embodiment has functions of a set-gain obtaining section 61, a determining section 62, and a function-on/off controlling section 63. The set-gain obtaining section 61 obtains a set-gain value that defines the gradient of the reference signal $V_{ref}$ set by the reference-signal generator 15 and that changes according to the amount of incident light.

The determining section 62 compares the set-gain value, obtained by the set-gain obtaining section 61, with a predetermined gain threshold to determine whether or not the function of the first or second embodiment is to be performed, and passes a result of the determination to the function-on/off controlling section 63. Now, a case in which the set-gain value is small when the amount of incident light is relatively large (i.e., when the incident light is relatively strong) and the set-gain value is large when the amount of incident light is relatively small (i.e., when the incident light is relatively weak) is discussed by way of example.

When the amount of incident light is relatively large, i.e., when the set-gain value exceeds a predetermined gain threshold, the determining section 62 determines that the function of the first or second embodiment is to be turned off (i.e., is not to be performed), and when the amount of incident light is relatively small, i.e., when the set-gain value is smaller than or equal to the predetermined gain threshold, the determining section 62 determines that the function of the first or second embodiment is to be turned on (i.e., is to be performed).

In response to the result of the determination made by the determining section 62, the function-on/off controlling section 63 controls whether or not the function of the first or second embodiment is to be performed. More specifically, for example, in FIG. 5, when the result of the determination made by the determining section 62 shows that the function is to be turned off, the function-on/off controlling section 63 brings the selection transistor 25 and the current-source cutoff transistors 51 into conduction, and when the result of the determination made by the determining section 62 shows that the function is to be turned on, the function-on/off controlling section 63 brings the selection transistor 25 and the current-source cutoff transistors 51 into non-conduction.

That is, the function-on/off controlling section 63 corresponds to a functional unit of the vertical driver 12 that performs driving for the conduction/non-conduction of the selection transistor 25 and a functional unit of the communication and timing controller 17 that performs driving for the conduction/non-conduction of the current-source cutoff transistors 51 and the current supply transistors 52.

The above description has been given of a case in which a determination as to whether or not the function of the first or second embodiment is to be performed is made based on the set-gain value that defines the gradient of the reference signal $V_{ref}$ set by the reference-signal generator 15 and that varies according to the amount of incident light. The present technology, however, is not limited thereto and may employ any configuration that makes the determination in accordance with the amount of incident light.

Determining whether or not to perform the function of the first or second embodiment in accordance with the amount of incident light in the manner described above allows driving that is optimal for settling the potentials of the vertical signal lines 32 to be performed according to the amount of incident light, as appropriate.

3. Application Example

Although a case in which the present technology is applied to a CMOS image sensor in which the unit pixels that detect, as physical quantities, signal charges corresponding to the amounts of visible light are two-dimensionally arranged in matrix has been described in the above-described embodiments, the present technology is not limited thereto. That is, the technology disclosed herein is applicable to any amplification solid-state image capture devices in which current supplies are connected to signal lines to which signals are output from unit pixels.

The application of the present technology is not limited to only solid-state image capture devices that detect distribution of the amount of incident visible light and capture the distribution as images, but also the present technology is applicable to solid-state image capture devices that capture distribution of the amount of incidence of infrared, X rays, particles, or the like as images. In a broad sense, the solid-state image capture devices may be physical-quantity-distribution detecting devices, including fingerprint sensors that detect distribution of other physical quantities, such as a pressure and an electrostatic capacitance, to capture the distribution as images.

Each of the solid-state image capture devices may take a form of one chip or may take an image-capture-function-equipped modular form into which an image capture unit and a signal processor or an optical system are packaged together.

4. Electronic Apparatus (Image Capture Device)

The present disclosure can be applied not only to soli-stage image capture devices but also to any electronic apparatuses using solid-state image capture devices as image pickup sections (photoelectric converting sections). Examples of the electronic apparatuses include image capture devices, such as digital still cameras and video cameras; mobile terminal devices (e.g., mobile phones) having image-capture functions; and copiers using solid-stage image capture devices as image readers. Each image capture device may also take the aforementioned modular form, i.e., a camera module, incorporated into an electronic apparatus.

Image Capture Device

FIG. 12 is a block diagram illustrating an exemplary configuration of an image capture device, which is one example of an electronic apparatus according to an embodiment of the present disclosure.

As illustrated in FIG. 12, an image capture device 100 according to an embodiment of the present disclosure includes an optical system including a lens group 101 and so on, an image capture element 102, a DSP (digital signal processor) circuit 103 serving as a camera-signal processor, a frame memory 104, a display device 105, a recording device 106, an operation system 107, a power-supply system 108, and so on. The DSP circuit 103, the frame memory 104, the display device 105, the recording device 106, the operation system 107, and the power-supply system 108 are interconnected through a bus line 109.

The lens group 101 captures light (image light) incident from a subject to form an image on an image capture plane of the image capture element 102. The image capture element 102 converts the amount of incident light of the image, formed on the image capture plane by the lens group 101, into electrical signals for respective pixels and outputs the electrical signals as pixel signals. The image capture element 102 may be implemented by the CMOS image sensor according to one of the above-described embodiments.

The display device 105 may be a panel display device, such as a liquid-crystal display device or an organic EL (electroluminescent) display device. The display device 105 displays a moving image or still image captured by the image capture element 102. The recording device 106 records the moving image or still image, captured by the image capture element 102, to a recording medium, such as a video table or a DVD (digital versatile disk).

The operation system 107 issues an operation instruction with respect to various functions of the image capture device. The power-supply system 108 supplies various types of power to the DSP circuit 103, the frame memory 104, the display device 105, the recording device 106, and the operation system 107 as power for operations thereof, as appropriate.

Such an image capture device 100 is also applicable to video cameras and digital still cameras, as well as camera modules for mobile apparatuses, such as mobile phones. The image capture device 100 may be implemented by the solid-state image capture device according to the embodiment described above as the image capture element 102.

5. Configuration in Present Disclosure

The present disclosure may have a configuration as described below.

(1) A solid-state image capture device including:
unit pixels including transfer gates that transfer charges to diffusion layers, the charges being obtained by photoelectric conversion performed by photoelectric converting sections;
signal lines to which signals output from the unit pixels are read out:
current sources connected to the signal lines; and
a driver that electrically cuts off connections between the unit pixels and the signal lines and the signal lines and the current sources in a transfer period of the transfer gates.

(2) The solid-state image capture device according to (1), wherein each unit pixel includes an amplification transistor that amplifies a signal converted into a voltage by the diffusion layer; and
a selection transistor selects the unit pixel that outputs a signal resulting from the amplification performed by the amplification transistor; and
the corresponding selection transistor is driven by the driver to electrically cut off the connection between the unit pixel and the signal line.

(3) The solid-state image capture device according to (2), wherein the selection transistor is connected between the amplification transistor and the signal line.

(4) The solid-state image capture device according to one of (1) to (3),
wherein a switching element is connected between the signal line and the current source, and
the switching element is driven by the driver to electrically cut off the connection between the signal line and the current source.

(5) The solid-state image capture device according to one of (1) to (4), further including current supply sections that supply currents to the corresponding current sources when the connections between the signal lines and the current sources are electrically cut off.

(6) The solid-state image capture device according to one of (1) to (5), wherein, in accordance with an amount of light incident on the photoelectric converting section, the driver determines whether or not the connection between the unit pixel and the signal line and the connection between the signal line and the current source are to be electrically cut off.

(7) The solid-state image capture device according to (6), wherein, when the amount of light incident on the photoelectric converting section is larger than a predetermined amount, the driver does not perform the electrical cutoff, and when the amount of light incident on the photoelectric converting section is smaller than or equal to the predetermined amount, the driver performs the electrical cutoff.

(8) The solid-state image capture device according to one of (1) to (7), further including analog-to-digital conversion circuits for the respective signal lines to convert analog signals into digital signal, the analog signals being read out from the corresponding unit pixels through the signal lines.

(9) The solid-state image capture device according to (8), wherein each analog-to-digital conversion circuit includes:
a comparing section that compares a reference signal with the corresponding analog signal, the reference signal having a gradually changing level; and
a counter section that performs a count operation on the basis of a result of the comparison performed by the comparing section,
wherein the analog-to-digital conversion circuit obtains a digital signal corresponding to the analog signal, in accordance with a result of the count operation performed by the counter section.

(10) The solid-state image capture device according to (9), wherein the driver compares a set-gain value with a predetermined gain threshold, the set-gain value defining a gradient of a level of the reference signal, and makes the electrical-cutoff determination in accordance with a result of the comparison.

(11) The solid-state image capture device according to (10), wherein, when the set-gain value is larger than the predetermined gain threshold, the driver does not perform the electrical cutoff, and when the set-gain value is smaller than or equal to the predetermined gain threshold, the driver performs the electrical cutoff.

(12) A drive method for a solid-state image capture device having
unit pixels including transfer gates that transfer charges to diffusion layers, the charges being obtained by photoelectric conversion performed by photoelectric converting sections,
signal lines to which signals output from the unit pixels are read out, and
current sources connected to the signal lines, the drive method including:
electrically cutting off, during driving the solid-state image capture device, connections between the unit pixels and the signal lines and the signal lines and the current sources in a transfer period of the transfer gates.

(13) An electronic apparatus including a solid-state image capture device as an image capture section,
wherein the solid-state image capture device includes:
unit pixels including transfer gates that transfer charges to diffusion layers, the charges being obtained by photoelectric conversion performed by photoelectric converting sections;
signal lines to which signals output from the unit pixels are read out:
current sources connected to the signal lines; and a driver that electrically cuts off connections between the unit pixels and the signal lines and the signal lines and the current sources in a transfer period of the transfer gates.

The present disclosure contains subject matter related to that disclosed in Japanese Priority Patent Application JP 2011-270282 filed in the Japan Patent Office on Dec. 9, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image capture device comprising:
unit pixels each including photoelectric converter, a diffusion layer, a transfer gate that transfers charge to the diffusion layer from the photoelectric converter;
signal lines to which the signals output from the unit pixels are read out;
current sources each of which is connected to a respective signal line; and
driver circuitry that breaks selected connections between the unit pixels and the signal lines and between the signal lines and current sources current source in a transfer period when the transfer gate transfers the charge from the photoelectric converter to the diffusion layer
wherein,
in accordance with an amount of light incident on the photoelectric converting section, the driver circuitry determines whether or not the connection between the unit pixel and the signal line and the connection between the signal line and the current source are to be electrically cut off.

2. The solid-state image capture device according to claim 1, wherein the selection switch is a transistor.

3. The solid-state image capture device according to claim 1, wherein the switches between the signal lines and the current sources are transistors.

4. The solid-state image capture device according to claim 1, further comprising current supply sections that supply currents to the corresponding current sources when the connections between the signal lines and the current sources are electrically cut off.

5. The solid-state image capture device according to claim 1, further comprising analog-to-digital conversion circuits, one for each of the respective signal lines, to convert analog signals into digital signals, the analog signals being read out from the corresponding unit pixels through the signal lines.

6. The solid-state image capture device according to claim 1, wherein, when the amount of light incident on the photoelectric converter is larger than a predetermined amount, the driver circuitry does not perform the electrical cutoff, and when the amount of light incident on the photoelectric converter is smaller than or equal to the predetermined amount, the driver circuitry performs the electrical cutoff.

7. A drive method for a solid-state image capture device having
(a) unit pixels, each including a photoelectric converter, a diffusion layer, a transfer gate that transfer charges from the photoelectric converter to the diffusion layer, an amplifier connected to the diffusion layer, and a selection switch connected to the amplifier,
(b) signal lines to which signals output from the unit pixels are read out, each selection switch being connected between a respective amplifier and a signal line
(c) current sources respectively connected to the signal lines, and
(d) signal line switches respectively connected between the signal lines and the respective current sources,
the drive method comprising:
for each unit pixel, electrically breaking connections between the unit pixel and the respective signal lines and between the respective signal line and its respective current source in a transfer period when the transfer gate transfer the charge from the photoelectric converter to the diffusion layer; and
for each unit pixel, in accordance with an amount of light incident on the photoelectric converting section, determining whether or not the connection between the unit pixel and the signal line and the connection between the signal line and the current source are to be electrically cut off.

8. An electronic apparatus comprising:
a solid-state image capture device; and
a lens to direct light to the solid-state image capture device, wherein the solid-state image capture device includes:
unit pixels each including photoelectric converter, a diffusion layer, an amplifier, a transfer gate that transfers charge to the diffusion layer from the photoelectric converter, and a selection switch, the amplifier connected to the diffusion layer to output a signal therefrom, the selection switch connected to an output of the amplifier;
signal lines to which the signals output from the unit pixels are read out, each selection switch connected between its respective amplifier and a signal line;
current sources each of which is connected to a respective signal line;
a respective signal line switch between each current source and its respective signal line; and
driver circuitry connected to the selection gates and the gates between the current sources and the signal lines, the driver circuitry configured to, for each unit pixel, control the selection switch and the switch between the respective signal line and its current source in a transfer period when the transfer gate transfers the charge from the photoelectric converter to the diffusion layer
wherein,
in accordance with an amount of light incident on the photoelectric converting section, the driver circuitry determines whether or not the connection between the unit pixel and the signal line and the connection between the signal line and the current source are to be electrically cut off.

9. A solid-state image capture device comprising:
unit pixels each including photoelectric converter, a diffusion layer, a transfer gate that transfers charge to the diffusion layer from the photoelectric converter;
signal lines to which the signals output from the unit pixels are read out;
current sources each of which is connected to a respective signal line;
driver circuitry that breaks selected connections between the unit pixels and the signal lines and between the signal lines and current sources current source in a transfer period when the transfer; and
analog-to-digital conversion circuits, one for each of the respective signal lines, to convert analog signals into digital signals, the analog signals being read out from the corresponding unit pixels through the signal lines, each analog-to-digital conversion circuit including (a) a comparator that compares a reference signal with the corresponding analog signal, the reference signal having a gradually changing level; and (b) a counter that performs a count operation on a basis of a result of the comparison performed by the comparator,
wherein
   the analog-to-digital conversion circuit generates a digital signal corresponding to the analog signal, in accordance with a result of the count operation performed by the counter, and the driver circuitry compares a set-gain value with a predetermined gain threshold, the set-gain value defining a gradient of a level of the reference signal, and makes the electrical-cutoff determination in accordance with a result of the comparison.

10. The solid-state image capture device according to claim 9, wherein, when the set-gain value is larger than the predetermined gain threshold, the driver circuitry does not perform the electrical cutoff, and when the set-gain value is smaller than or equal to the predetermined gain threshold, the driver circuitry performs the electrical cutoff.

* * * * *